(12) United States Patent
Tsuda

(10) Patent No.: US 7,913,367 B2
(45) Date of Patent: Mar. 29, 2011

(54) METHOD OF MANUFACTURING A PIEZOELECTRIC COMPONENT

(75) Inventor: Toshimasa Tsuda, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 225 days.

(21) Appl. No.: 12/157,913

(22) Filed: Jun. 13, 2008

(65) Prior Publication Data

US 2009/0001849 A1 Jan. 1, 2009

(30) Foreign Application Priority Data

Jun. 27, 2007 (JP) ................. 2007-168552

(51) Int. Cl.
*H04R 17/10* (2006.01)
(52) U.S. Cl. .............. 29/25.35; 438/778; 310/313 B; 310/340; 310/349; 310/365
(58) Field of Classification Search ........... 29/25.35, 29/594, 841, 846; 428/1.3; 333/193; 310/313 B, 310/340, 348, 349, 363, 365; 438/758, 778
See application file for complete search history.

(56) References Cited

U.S. PATENT DOCUMENTS

| | | | | |
|---|---|---|---|---|
| 5,071,509 | A * | 12/1991 | Kano et al. | 29/846 X |
| 6,602,563 | B2 * | 8/2003 | Kobayashi et al. | 428/1.3 |
| 2004/0196119 | A1 * | 10/2004 | Shibahara et al. | 333/193 |
| 2006/0040435 | A1 * | 2/2006 | Morisue et al. | 438/758 X |
| 2006/0192462 | A1 * | 8/2006 | Iwamoto et al. | 310/348 |

FOREIGN PATENT DOCUMENTS

| | | |
|---|---|---|
| EP | 1 772 962 | 4/2007 |
| EP | 1 892 831 | 2/2008 |
| JP | 3-209909 | * 9/1991 |
| JP | HEI 11-157990 | 6/1999 |
| JP | 2002 217673 | 8/2002 |
| JP | 2004-147220 | 5/2004 |
| JP | 2005 252335 | 9/2005 |
| JP | 2006 324894 | 11/2006 |
| WO | PCT/FR99/03036 | 12/1999 |
| WO | WO 2006/134928 | 12/2006 |

OTHER PUBLICATIONS

Machine Translation of JP 2005-252335.*
European Search Report dated Mar. 25, 2009.

* cited by examiner

*Primary Examiner* — A. Dexter Tugbang
(74) *Attorney, Agent, or Firm* — Scott D. Wofsy; Edwards Angell Palmer & Dodge LLP

(57) ABSTRACT

A piezoelectric component with a piezoelectric element includes a piezoelectric substrate, at least one oscillating section formed on the piezoelectric substrate, and an element wiring section connected to the oscillating section. A side face side hollow section forming layer and a lid face side hollow section forming layer made of photosensitive resin surround the top face and side face of the oscillating section while forming a gap so as to provide a hollow section.

11 Claims, 4 Drawing Sheets

METHOD OF MANUFACTURING A PIEZOELECTRIC COMPONENT

BACKGROUND OF THE INVENTION

The present invention relates to a surface acoustic wave device (SAW device) to be used in a filter that is used in a mobile communication device or the like such as a mobile phone, and to a piezoelectric component such as piezoelectric membrane filter or the like, in particular, to a chip-size packaged piezoelectric component and a manufacturing method thereof.

A SAW device to be equipped in a mobile phone or the like requires a gap provided around a comb-shaped electrode (IDT electrode) of the SAW device.

Conventionally, a SAW device has been packed in which a SAW element chip is die-bonded on a ceramic case in a face-up state and its wiring is electrically connected by wire-bonding, and then a metallic cap is placed over the case and the matching face between the cap and case is seam-welded or sealed with solder.

Furthermore, recently, in order to downsize a SAW device, a small sized package SAW device is configured such that the SAW element chip is flip-chip-bonded (face down bonded) on a wiring substrate using Au bumps or other bumps, and sealing is carried out with a resin or the like.

Moreover, in order to reduce the size and height of a SAW device, there has been proposed a micro chip size package SAW device in which: a gap (hollow section) is formed in comb-shaped electrode sections; an entire piezoelectric wafer on the comb-shaped electrode side is sealed while maintaining this gap; an external connection electrode is formed; and then the sealed entire wafer is divided into individual SAW devices by dicing refer to Published Japanese Translation of PCT Application No. 2002-532934 (conventional example 1), and Japanese Unexamined Patent Publication No. 2004-147220 (conventional example 2).

CONVENTIONAL EXAMPLE 1

First, in the SAW device disclosed in Published Japanese Translation of PCT Application (TOKUHYO) No. 2002-532934 (Patent Document 1), as shown in FIG. 5, a gap forming layer 111 made of photosensitive resin is formed on the surface of a SAW chip 114, and a printed substrate 115 is adhered thereon with an adhesive layer, thereby sealing the SAW device while forming a gap S on the comb-shaped electrode. Here, the comb-shaped electrode is electrically connected to external connection electrodes 171 and 172 via power supply contact sections 110 and 112 and conductive via holes.

CONVENTIONAL EXAMPLE 2

Next, in the SAW device disclosed in Japanese Unexamined Patent Publication No. 2004-147220 (Patent Document 2), as shown in FIG. 6, a gap forming layer 205 made of photosensitive resin is formed on the surface of a piezoelectric substrate 202, on which a comb-shaped electrode 203 is formed, and the portion above this is sealed with an insulating layer 206 made of photosensitive resin while forming a gap S over the comb-shaped electrode 203. Here, the comb-shaped electrode 203 is electrically connected to external connection electrodes 212 via bumps 207 or the like. Furthermore, a mount substrate 210 formed with a ceramic substrate or glass epoxy substrate is connected to this package structure, and the entire outer face of the SAW chip is coated with a sealing resin 220.

However, the following problems are present in the package structure of the SAW device disclosed in the above mentioned conventional examples 1 and 2.

Specifically, there is a problem in that on a path from outside the package to the comb-shape electrode, there is an insulating layer formed with a printed substrate and a photosensitive resin, or there is a moisture interfusion path configured only with organic materials such as sealing resin. Therefore, a complete airtight sealing structure is not achieved. If its humidity resistance is poor like this, humidity causes alteration to the properties of the comb-shaped electrode and increases a loss in the SAW, resulting in a reduction in the performance of the SAW device.

Moreover, there is also a problem in that in such a package structure having through electrodes provided in the piezoelectric substrate or in the glass substrate, a highly precise laminating apparatus is required, resulting in an increase in manufacturing cost.

The problems to be solved by the present invention are the alteration to the properties of an oscillating section (comb-shaped electrode) due to the poor humidity resistance of the piezoelectric component, and its high manufacturing cost.

SUMMARY OF THE INVENTION

The present invention relates to a piezoelectric component with a piezoelectric element having a piezoelectric substrate, at least one oscillating section formed on the piezoelectric substrate, and an element wiring section connected to the oscillating section, and is characterized in that a side face side hollow section forming layer and a lid face side hollow section forming layer made of photosensitive resin surround the top face and side face of the oscillating section while forming a gap so as to provide a hollow section, and there are further provided: an insulating protective layer made of photosensitive resin that covers and protects the top face of the element wiring section excluding its electrode formation section, the side face of the side face side hollow section forming layer, and the side face of the lid face side hollow section forming layer; an insulating layer made of photosensitive resin that covers and seals the entire face of the insulating protective layer; through electrodes that are interposed in through holes through-formed in the insulating layer so as to connect to the element wiring electrode section; and external electrode terminals that are formed on the same outer face of the insulating layer so as to connect to the through electrodes.

Furthermore, the present invention relates to a piezoelectric component with a piezoelectric element having a piezoelectric substrate, at least one oscillating section formed on the piezoelectric substrate, and an element wiring section connected to the oscillating section, and is characterized in that a side face side hollow section forming layer and a lid face side hollow section forming layer made of photosensitive resin surround the top face and side face of the oscillating section while forming a gap so as to provide a hollow section, and in that it further comprises: an insulating protective layer made of photosensitive resin that covers and protects the top face of the element wiring section excluding its electrode formation section, the side face of the side face side hollow section forming layer, and the side face of the lid face side hollow section forming layer; an insulating layer made of photosensitive resin that covers and seals the entire face of the insulating protective layer; through electrodes that are interposed in through holes through-formed in the insulating layer so as to connect to the element wiring electrode section; an impedance circuit element formed on the same outer face of the insulating layer; another insulating layer made of photosensitive resin formed on the circuit element layer; and another through electrode that passes through the insulating layer formed on the circuit element layer, and the impedance circuit element layer and the another insulating layer are laminated several times, and on the top most face of the last layer of the another insulating layer there are provided external electrode terminals that connect to the through electrodes.

Moreover, the present invention relates to a method of manufacturing a piezoelectric component with a piezoelectric element having a piezoelectric substrate, at least one oscillating section formed on the piezoelectric substrate, and an element wiring section connected to the oscillating section, and where a side face side hollow section forming layer and a lid face side hollow section forming layer made of photosensitive resin surround the top face and side face of the oscillating section while forming a gap so as to provide a hollow section, and that is further provided with: an insulating protective layer made of photosensitive resin that covers and protects the top face of the element wiring section excluding its electrode formation section, the side face of the side face side hollow section forming layer, and the side face of the lid face side hollow section forming layer; an insulating layer made of photosensitive resin that covers and seals the entire face of the insulating protective layer; through electrodes that are interposed in through holes through-formed in the insulating layer so as to connect to the element wiring electrode section; and external electrode terminals that are formed on the same outer face of the insulating layer so as to connect to the through electrodes, the method comprising:

a step of forming the oscillating section and the element wiring section on a collective substrate having undivided pieces of the piezoelectric substrate, and further carrying out a predetermined patterning;

a step of coating, light-exposing, and developing a photosensitive resin that serves as the side face side hollow section forming layer on the piezoelectric substrate, and subsequently coating, light-exposing, and developing a photosensitive resin on a layer that serves as the side face side hollow section forming layer;

a step of removing patterns from locations on the photosensitive resin layer that correspond to the oscillating section and the through holes, so as to form the side face side hollow section forming layer and the lid face side hollow section forming layer;

a step of forming, by means of sputtering, an insulating protective film on the side face and the lid face that have been formed;

a step of removing portions of the insulating protective film that correspond to the electrodes of the element wiring, by means of photolithography and etching;

a step of coating a photosensitive resin on the entire main face so as to form at least one insulating layer, forming the through holes in the insulating layer, and forming the through electrodes by filling the through holes with plating;

a step of forming a metallic plating on the top face of the final layer of the insulating layer, and then forming the external electrodes by means of plating; and a step of dicing the processed collective substrate along dicing marks into individual pieces.

Furthermore, the present invention relates to a method of manufacturing a piezoelectric component with a piezoelectric element having a piezoelectric substrate, at least one oscillating section formed on the piezoelectric substrate, and an element wiring section connected to the oscillating section, and where a side face side hollow section forming layer and a lid face side hollow section forming layer made of photosensitive resin surround the top face and side face of the oscillating section while forming a gap so as to provide a hollow section, and that further comprises: an insulating protective layer made of photosensitive resin that covers and protects the top face of the element wiring section excluding its electrode formation section, the side face of the side face side hollow section forming layer, and the side face of the lid face side hollow section forming layer; an insulating layer made of photosensitive resin that covers and seals the entire face of the insulating protective layer; through electrodes that are interposed in through holes through-formed in the insulating layer so as to connect to the element wiring electrode section; an impedance circuit element formed on the outer face of the insulating layer; another insulating layer made of photosensitive resin formed on the circuit element layer; and another through electrode that passes through the insulating layer formed on the circuit element layer, and the impedance circuit element layer and the another insulating layer are alternately laminated several times, and on the top most face of the last layer of the another insulating layer there are provided external electrode terminals that connect to the through electrodes, the method comprising:

a step of forming the oscillating section and the element wiring section on a collective substrate having undivided pieces of the piezoelectric substrate, and further carrying out a predetermined patterning;

a step of coating, light-exposing, and developing a photosensitive resin that serves as the side face side hollow section forming layer on the piezoelectric substrate, and subsequently coating, light-exposing, and developing a photosensitive resin on a layer that serves as the side face side hollow section forming layer;

a step of removing patterns from locations on the photosensitive resin layer that correspond to the oscillating section and the through holes, so as to form the side face side hollow section forming layer, and the lid face side hollow section forming layer;

a step of forming, by means of sputtering, an insulating protective film on the side face and the lid face that have been formed;

a step of removing portions of the insulating protective film that correspond to the electrodes of the element wiring, by means of photolithography and etching;

a step of coating a photosensitive resin on the entire main face so as to form at least one insulating layer, forming the through holes in the insulating layer, and forming the through electrodes by filling the through holes with plating;

a step of laminating the impedance circuit element layer on the another insulating layer;

a step of laminating the impedance circuit element layer and the another insulating layer several times;

a step of forming a metallic plating on the top face of the final layer of the insulating layer, and then forming the external electrodes by means of plating; and a step of dicing the processed collective substrate along dicing marks into individual pieces.

It is possible to provide a piezoelectric component that is capable of effectively preventing moisture interfusion into the interior of the piezoelectric component, and that has an excellent level of reliable humidity resistance under the present invention.

Piezoelectric components having a structure of the present invention can be widely used for a SAW device, a crystal oscillator, FBAR (film bulk acoustic resonator), MEMS (micro electro mechanical systems) and the like, and these piezoelectric components can be manufactured at low cost according to the piezoelectric component manufacturing method of the present invention.

DETAILED DESCRIPTION OF THE PREFERRED EMBODIMENT

Hereinafter, a piezoelectric component and its manufacturing method of the present invention is described in detail as embodiments of a mount type surface acoustic wave device (hereinafter, referred to as "SAW device").

Piezoelectric Component

Figure 1:
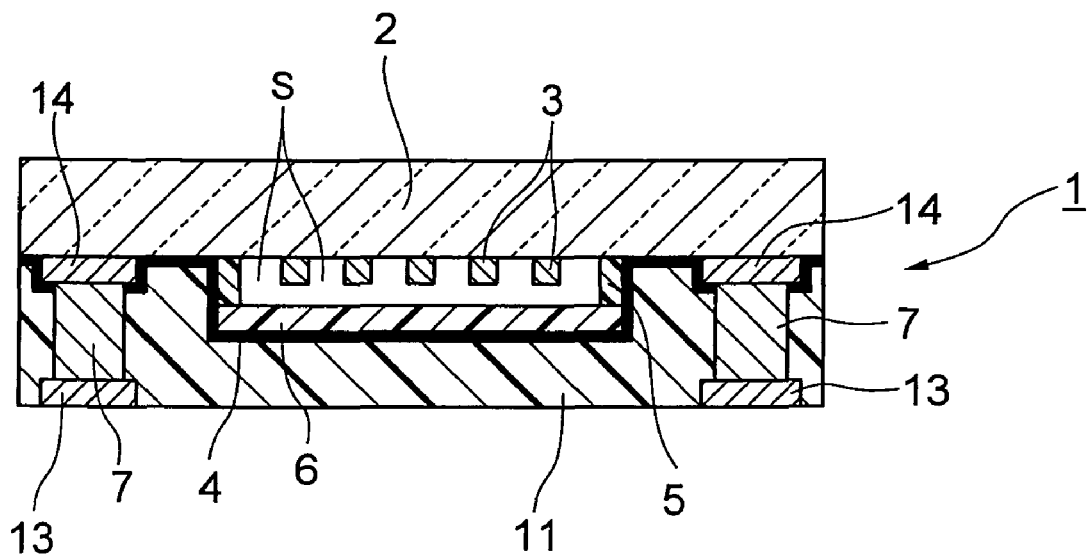
FIG. 1 is a vertical sectional view of an embodiment of a piezoelectric component of the present invention.

FIG. 1 shows a vertical sectional view of a SAW device 1 that is an embodiment of a piezoelectric component of the present invention.

As shown in FIG. 1, this SAW device 1 comprises: a piezoelectric substrate 2, for example, made of lithium tantalite ($LiTaO_3$), lithium niobate ($LiNbO_3$), quartz, Si, or sapphire; a plurality of comb shaped electrodes (IDT electrodes) 3 (oscillating sections) and element wiring sections 14 formed on this piezoelectric substrate 2; a side face side hollow section forming layer 5 and a lid face side hollow section forming layer 6 that form a gap (hollow section) S on the lid face side and the side face side of these comb shaped electrodes (IDT electrodes) 3; an insulating protective film 4 that seamlessly covers and protects both of these hollow section forming layers 5 and 6 (except for the electrode portions); and an insulating layer 11a that seals this insulating protective film 4. Here, the insulating layer 11a is configured with an electrically insulating inorganic material so as to cover the insulating protective film 4.

Furthermore, in order to ensure electrical connection between the comb-shaped electrodes (IDT electrodes) 3 and an external circuit: through the insulating layer 11a, there are formed conductive via holes (through holes) that pass through the insulating layer 11a and connect to the comb-shaped electrodes (IDT electrodes) 3; these via holes are filled by metal plating so as to form through electrodes 7; and on the outer end sections of the through electrodes 7 there are formed external terminals 13.

Moreover, the side face side hollow section forming layer 5 and the lid face side hollow section forming layer 6 are configured with benzocyclobutene, thermal setting fluoropolymer, photosensitive acrylic epoxy resin or a highly permeable photosensitive resin such as a photosensitive polyimide resin, or with a combination of these resins.

Here, the insulating protective layer 4 is configured with Si, $SiO_2$, $Al_2O_3$, $Si_3N_4$, diamond or the like, and element wiring is configured with a material, the main component of which is any one of Al, Cu, Au, Cr, Ni, Ti, W, V, Ta, Ag, In, and Sn, or it is configured with a mixture or multilayer of these materials.

Moreover, the number of hollow sections formed so as to cover the piezoelectric elements is configured to be greater by one than or at least equal to the number of a plurality of the piezoelectric elements.

Furthermore, the insulating layer is formed from an organic material made with benzocyclobutene, thermal setting fluoropolymer, photosensitive epoxy resin, or polyamide, or from a material that combines these materials, and the thickness of the insulating layer is greater than or equal to 1,000 angstrom (Å).

Moreover, on the back face of the piezoelectric substrate 2, there may be provided a layer made from a conductive or non-conductive material for protection of the piezoelectric components.

Figure 2:
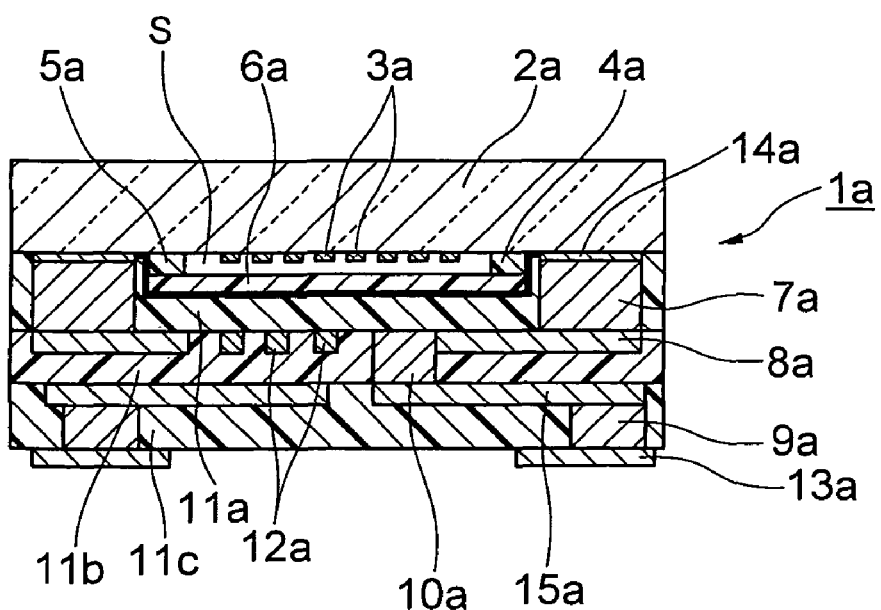
FIG. 2 is a vertical sectional view of another embodiment of the piezoelectric component of the present invention.

FIG. 2 shows a vertical sectional view of a SAW device 1a configured with a plurality of impedance circuit layers laminated on the above mentioned SAW device.

As shown in FIG. 2, this SAW device 1a, as with the SAW device 1 in FIG. 1, comprises: a piezoelectric substrate 2a; a plurality of comb-shaped electrodes (IDT electrodes) formed on this piezoelectric substrate 2a; a side face hollow section forming layer 5a made of photosensitive resin that forms a gap (middle section) S on the lid face and the side face of these comb-shaped electrodes (IDT electrodes) 3a; a lid face hollow section forming layer 6a; an insulating protective film 4a; a first insulating layer 11a; a through electrode 7a that connects to element wiring electrode sections 4a and 8a formed in through holes passing through this first insulating layer 11a; impedance circuit elements 12a formed on the same face of the insulating layer 11a; a second insulating layer 11b made of photosensitive resin that is formed on these circuit elements 12a; a first through electrode 7a and a second through electrode 10a that pass through the insulating layers 11a and 11b respectively provided on the circuit wiring; an element wiring 15a that connects to the second through electrode 10a; and a third through electrode 9a that connects to this element wiring. These impedance circuit element layers 12a (constituting an inductance or capacitance by means of meandering wiring or the like) are laminated several times and then sealed by a final insulating layer 11c, on the top most face of which there are provided external electrodes 13a.

Moreover, on the back face of the piezoelectric substrate 2a, there may be provided a layer made from a conductive or non-conductive material for protection of piezoelectric components.

Furthermore, the piezoelectric substrate 2a, the hollow section forming layers 5a and 6a, the insulating protective film 4a, and the insulating layers 11a, 11b, and 11c are configured with the same materials as those of the SAW device 1 shown in FIG. 1.

Here, the impedance circuit comprises an inductance circuit or a conductance circuit, or a circuit formed with a combination of these circuits.

Method of Manufacturing a Piezoelectric Component

Figure 3:
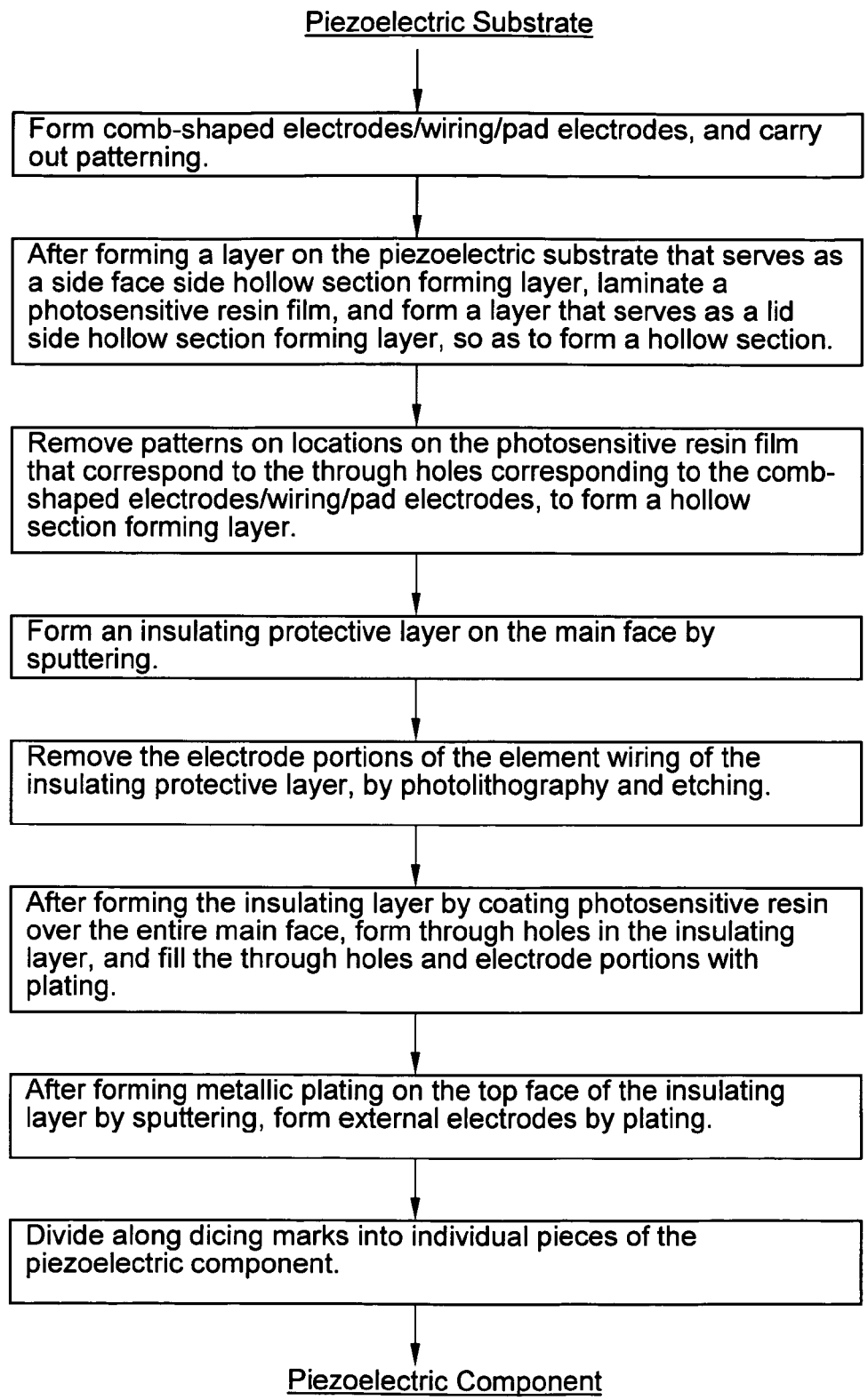
FIG. 3 is a flow chart showing a basic concept of a method of manufacturing the piezoelectric component of the present invention.

Next, the basic concept of a SAW device manufacturing method of an embodiment of the piezoelectric component manufacturing method of the present invention is described based on FIG. 3.

(Step 1) A piezoelectric substrate wafer (collective substrate) W formed from $LiTaO_3$, $LiNbO_3$, or the like is prepared. Then, the comb-shaped electrodes 3 and wiring/pad electrodes to be connected to the comb-shaped electrodes 3 are formed on the piezoelectric substrate wafer W by sputtering or vapor depositing Al base alloy including Al, Al-0.5%

Cu, or the like, and furthermore, a predetermined patterning is carried out by means of photolithography.

(Step 2) Having formed a layer that serves as the side face side hollow section forming layer 5 on the piezoelectric substrate wafer 2 on which the comb-shaped electrodes 3 and the wiring/pad electrodes are formed, a photosensitive resin film is laminated on this hollow section forming layer 5 so as to form the lid face side hollow section forming layer 6, thereby forming the hollow section (gap) that surrounds the comb-shaped electrodes 3. As the photosensitive resin film, a photosensitive resin material made of photosensitive acrylic/epoxy base resin or photosensitive polyimide base resin is preferable.

(Step 3) Locations on the photosensitive resin film that correspond to the conductive via hole sections in the positions corresponding to the comb-shaped electrodes 3 and the wiring/pad electrodes, are patterning-removed by means of photolithography so as to form the hollow section forming layers 5 and 6.

(Step 4) The insulating protective film 4 is formed on the main face by sputtering $SiO_2$ or the like.

(Step 5) Portions of the insulating protective film 4 that correspond to the electrode portions of the element wirings 14 are removed by means of photolithography.

(Step 6) Photosensitive resin is coated on the entire main face including the insulating protective film 4; an insulating layer in which the photosensitive resin has cured, is formed by carrying out photolithography or irradiating a laser; through holes are provided in this insulating layer; and these through holes and the electrode portions on the element wiring are provided by means of plating. Electrodes are bonded by filling fused solder or by means of conductive paste print filling.

(Step 7) A metallic plating is formed, by means of sputtering, on the top face of the insulating layer that has been lastly formed, and then the external electrodes 13 are formed by means of plating.

Lastly, the wafer (collective substrate) is diced along dicing marks, thereby obtaining each of the individual SAW devices.

Moreover, by carrying out the step 5 to step 7, an inductor having a spiral wiring or meandering wiring, or a conductance circuit in which high-permittivity material is laminated, is formed so as to form the external terminals.

Figure 4:
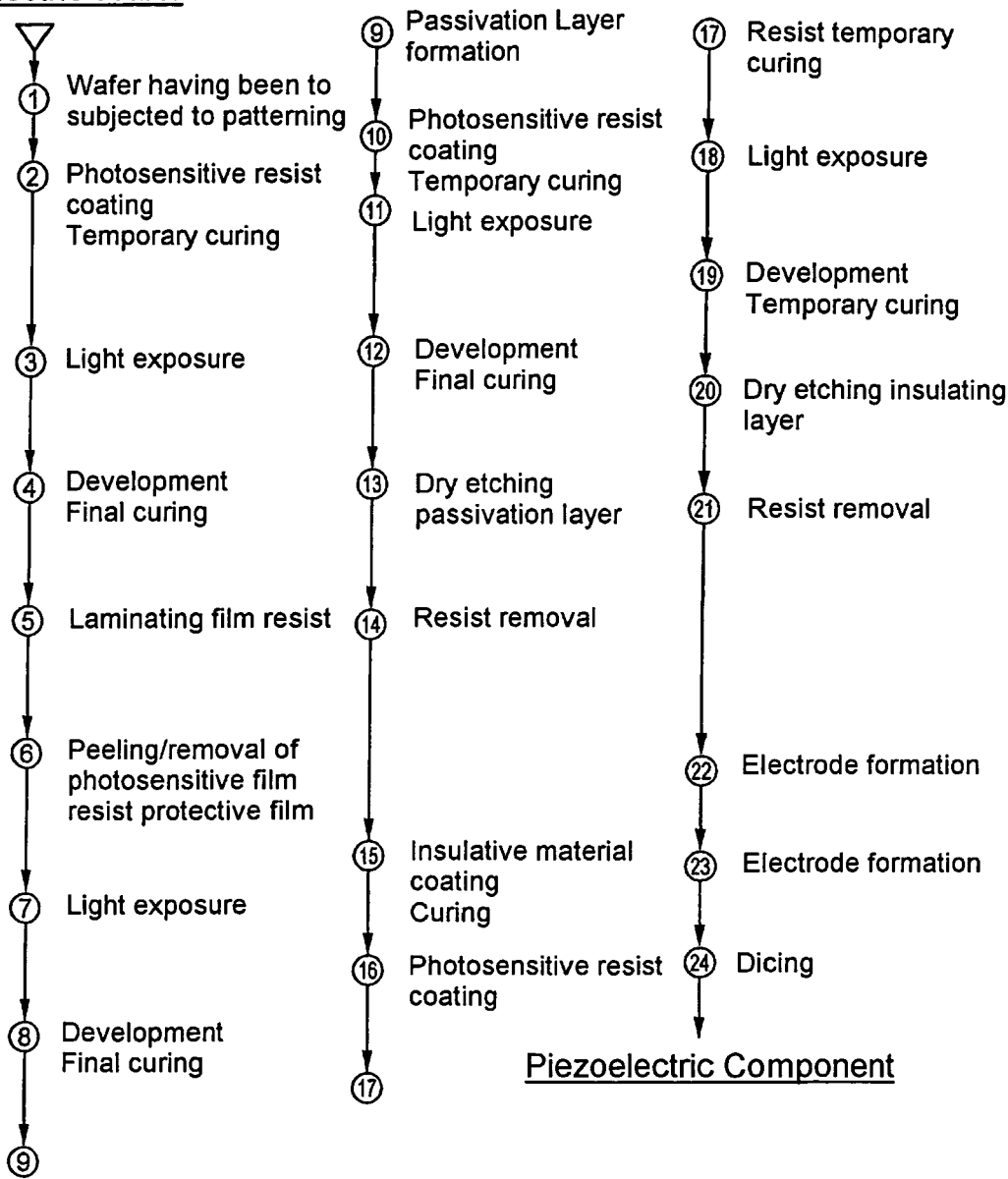
FIG. 4 is a flow chart showing details of the manufacturing steps of the piezoelectric component of the present invention.
Figure 5:
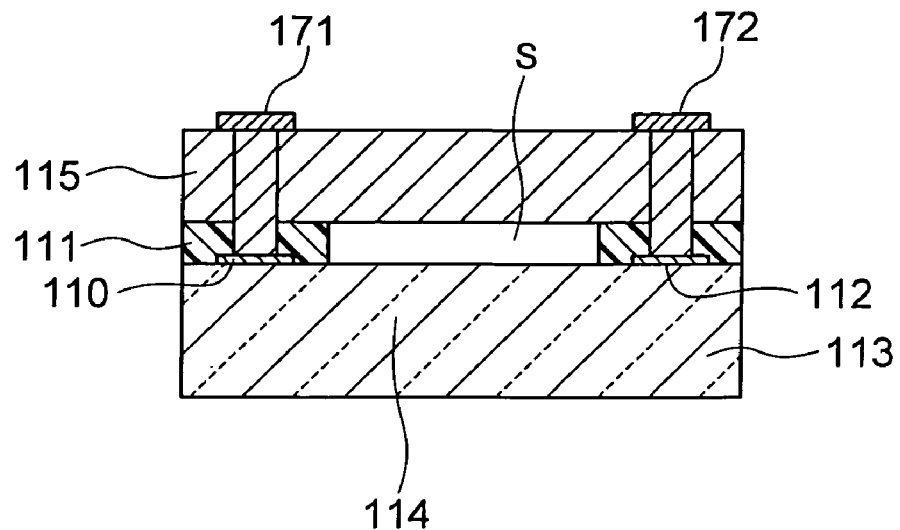
FIG. 5 is a vertical sectional view of a SAW device of a conventional example 1.
Figure 6:
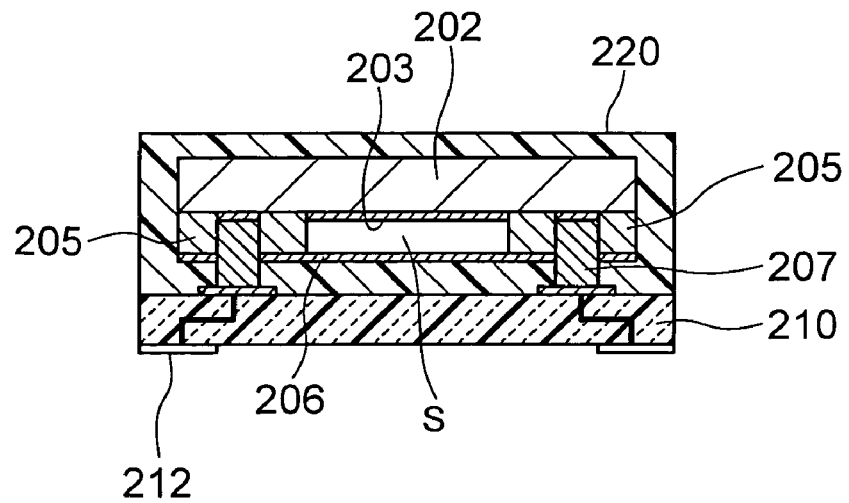
FIG. 6 is a vertical sectional view of a SAW device of a conventional example 2.

Next, SAW device manufacturing steps are described in detail based on FIG. 4 in the order of the steps, as an embodiment of the piezoelectric component manufacturing method of the present invention.

First, as shown in FIG. 4: the comb-shaped electrodes (IDT electrodes) and the wiring electrodes are formed; the wafer W for which patterning has been carried out, is loaded in a manufacturing apparatus (step 1); and in order to form the hollow section forming layers 5 and 6 (refer to FIG. 1), a resist made of liquid state photosensitive resin is coated by means of spin-coating (may be either positive type or negative type), and then heat application is carried out for temporary curing (step 2). Subsequently: a resist layer is light-exposed (UV irradiation) through a photomask and is then developed (step 3); the remaining portion is further light-exposed to be fully cured so as to form a layer that serves as the side face side hollow section forming layer 5 (step 4); a thermal setting film resist having a protective film is laminated on the side face side hollow section forming layer 5 (step 5); the protective film is peeled and removed (step 6); then the film resist layer is light exposed (UV irradiation) through a predetermined photomask (step 7); a further development is carried out (step 8); and the lid face side hollow section forming layer 6 is formed (step 8).

Next, on the hollow section forming layers 5 and 6 and the wiring electrodes surrounding, via a predetermined gap (middle section), the previously formed comb-shaped electrodes (IDT electrodes), a diamond membrane (for example, refer to Japanese Patent Publication No. 3125046) is formed by means of plasma CVD or ECR sputtering with use of $SiO_2$, or by means of PVD or low temperature CVD, and a passivation layer (insulating protective film 6) is formed by means of SiN/SiON P-CVD (step 9). Furthermore, a photoresist is coated and temporarily cured (step 10); the photoresist layer is light exposed (UV irradiation) through a predetermined photomask (step 11); and then it is developed (step 12), thereby forming the first insulating layer 11. Subsequently, one portion of the passivation layer (insulating protective film 6) is removed by means of dry etching ($CF_4+O_2$ gas plasma) (steps 13, 14) so as to expose the through electrodes 7. Then, having coated and cured an insulating material (BCB/Low-k polymer) on the top face of the passivation layer (step 15) by means of spin coating, a photoresist is coated by means of spin coating (step 16).

Furthermore, the photoresist layer is temporarily cured (step 17); it is light exposed through a predetermined photomask (step 18); it is subjected to an alkaline development (step 19); and a dry etching (for example etching rate: 0.1 μm/min) is carried out with use of $O_2$ or $SF_4O_2$ (step 20), to remove the photoresist layer (step 21), thereby forming the second insulating layer.

Lastly, having formed the through electrodes 7 (Cu) by filling the through holes by plating (step 22), a contact end is formed on a connecting end of each of the through electrodes 7 by means of plating (NiAu plating or Sn electrolytic plating) (step 23), and the wafer is diced either on the front face or back face, in principle, from the active face of the SAW chip, along dicing marks, to thereby manufacture individual SAW devices.

In the case of manufacturing the SAW device having a conductance circuit shown in FIG. 2, the above mentioned steps (step 16) to (step 22) are repeated to form the impedance circuit layers.

What is claimed is:

1. A method of manufacturing a piezoelectric component with a piezoelectric element having a piezoelectric substrate, at least on oscillating section formed on said piezoelectric substrate, a piezoelectric element wiring section connected to said oscillating section, and where a side face side hollow section forming layer and a lid face side hollow section forming layer made of photosensitive resin surround a top face and side face of said oscillating section while forming a gap so as to provide a hollow section, and further provided with: an insulating protective film made of photosensitive resin that covers and protects the top face of said piezoelectric element wiring section and is separated from an electrode formation section, the insulating protective film also covers and protects a side face of the side face side hollow section forming layer and a top face of said lid face side hollow section forming layer; an insulating layer made of photosensitive resin that covers and seals an entire top face of said insulating protective film; through electrodes that are interposed in through holes through-formed in said insulating layer so as to connect to said piezoelectric element wiring section; and external electrode terminals that are formed on the outer face of said insulating layer so as to connect to said through electrode, said method comprising the steps of:

forming said one oscillating section and said piezoelectric element wiring section on a collective substrate having undivided pieces of said piezoelectric substrate, and further carrying out a predetermined patterning;

coating, light-exposing, and developing the photosensitive resin that serves as said side face side hollow section forming layer on said piezoelectric substrate, and subsequently coating, light-exposing, and developing a photosensitive resin layer on the layer that serves as said side face side hollow section forming layer so as to form said lid face side hollow section forming layer;

removing patterns from locations on said photosensitive resin layers that correspond to said electrode formations section;

forming, by means of sputtering, an insulating protective film on said side face side hollow section forming layer and said lid face side hollow section forming layer;

removing portions of said insulating protective film that correspond to the electrode formation section, by means of photolithography and etching;

coating a photosensitive resin on said entire top face of said insulating protective film so as to form at least one insulating layer, forming said through holes in said insulating layer, and directly forming said through electrodes by filling said through holes with plating on said element wiring section;

forming a metallic plating on a top face of said insulating layer, and then forming said external electrodes by means of plating on a distal end of said through electrodes; and dicing said processed collective substrate along dicing marks into individual pieces.

2. A method of manufacturing a piezoelectric component according to claim 1, wherein said side face side hollow section forming layer is formed from an organic material made with benzocyclobutene, thermal setting fluoropolymer, photosensitive epoxy resin, or polyamide, or from a material that combines these materials.

3. A method of manufacturing a piezoelectric component according to claim 1, wherein said lid face side hollow section forming layer is formed with a photosensitive film.

4. A method of manufacturing a piezoelectric component according to claim 1, wherein said insulating protective film is made of any one of Si, $SiO_2$, $Al_3O_3$, $Si_3N_4$, or diamond.

5. A method of manufacturing a piezoelectric component according to claim 1, wherein said insulating protective film is either one of a $SiO_2$ film and a Si film formed by means of either one of sputtering, plasma CVD, and liquid glass coating.

6. A method of manufacturing a piezoelectric component according to claim 1, wherein said insulating protective film is a diamond membrane formed by means of low temperature CVD.

7. A method of manufacturing a piezoelectric component according to claim 1, wherein said element wiring section is formed with a material, the main component of the material is any one of Al, Cu, Au, Cr, Ni, Ti, W, V, Ta, Ag, In, and Sn, or the material is configured with a mixture or multilayer of these materials.

8. A method of manufacturing a piezoelectric component according to claim 1, wherein said piezoelectric substrate is made of any one of $LiTaO_3$, $LiNbO_3$, quartz, Si, and sapphire.

9. A method of manufacturing a piezoelectric component according to claim 1, wherein said insulating layer is formed with an organic material made of benzocyclobutene, thermal setting fluoropolymer, photosensitive epoxy resin, or polyamide, or from a material that combines these materials.

10. A method of manufacturing a piezoelectric component according to claim 1, wherein when forming said through electrodes, said through electrodes and said element wiring sections are connected by means of electrolytic plating.

11. A method of manufacturing a piezoelectric component according to claim 1, wherein wiring electrically connected to said through electrodes are formed by filling with plating or fused solder, or by filling with conductive paste.

* * * * *